Figure 1:
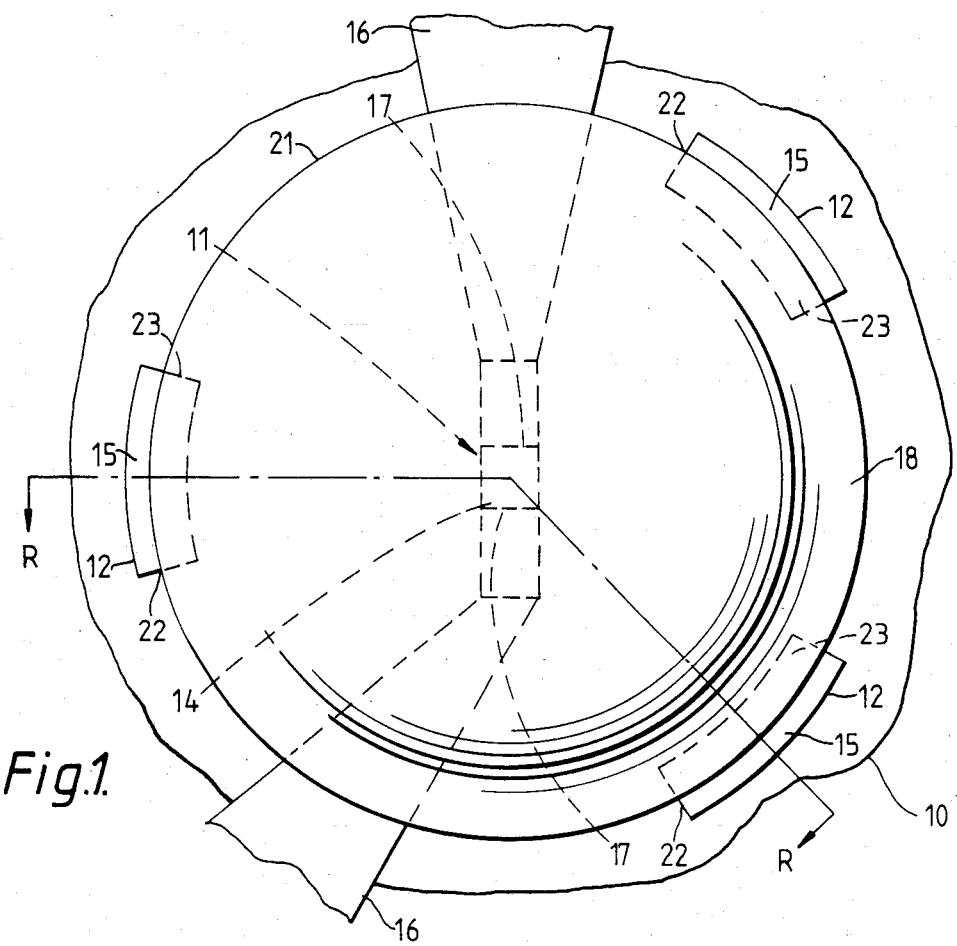

United States Patent [19]

Carmichael et al.

[11] Patent Number: 4,629,892
[45] Date of Patent: Dec. 16, 1986

[54] OPTICALLY IMMERSED DETECTOR ASSEMBLY

[75] Inventors: Ian C. Carmichael, Malvern; David J. Wilson, Malvern Link; Anthony B. Dean, Malvern, all of England

[73] Assignee: The Secretary of State for Defence in Her Britannic Majesty's Government of the United Kingdom of Great Britain and Northern Ireland, London, England

[21] Appl. No.: 558,589

[22] Filed: Dec. 6, 1983

[30] Foreign Application Priority Data

Dec. 22, 1982 [GB] United Kingdom ............... 8236446

[51] Int. Cl.⁴ .............................................. G02F 1/01
[52] U.S. Cl. ..................................... 250/353; 250/370
[58] Field of Search ................... 250/211 R, 216, 353, 250/370 R

[56] References Cited

U.S. PATENT DOCUMENTS 2,964,636 12/1960 Cary ..................................... 250/353
3,239,675 3/1966 Morey et al. ....................... 250/353
3,368,078 2/1968 Flint et al. .......................... 250/353

FOREIGN PATENT DOCUMENTS

EP0044110 1/1982 European Pat. Off. .

Primary Examiner—John D. Smith
Assistant Examiner—Janyce A. Bell
Attorney, Agent, or Firm—Stevens, Davis, Miller & Mosher

[57] ABSTRACT

An optically immersed infra-red detector assembly comprises a planar sapphire substrate bearing a detector with radially disposed lens contact pads. The detector and contact pads are produced by etching a single portion of cadmium mercury telluride and have mutually coplanar surfaces. A hemispherical silicon optical immersion lens is bonded to the pads by applying dilute adhesive to lens-pad interfaces. Capillary attraction draws the adhesive between the lens and the pads to form very thin layers of adhesive after solvent evaporation. The adhesive layers ensure that an air gap is produced between the lens and detector, the gap being much smaller than the infra-red wavelength of interest as required to ensure optical immersion of the detector by the lens.

6 Claims, 2 Drawing Figures

U.S. Patent    Dec. 16, 1986    4,629,892

OPTICALLY IMMERSED DETECTOR ASSEMBLY

The invention relates to a detector assembly, and more particularly but not exclusively, to an optically immersed infra red detector assembly.

Optical immersion of semiconducting infra-red detectors such as cadmium mercury telluride (CMT) is known for the purposes of increasing sensitivity (see eg Slawek and Randall, Infra-red Physics 1975, vol 15, p.339). The need for optical immersion arises as follows. An increased signal would be obtainable by increasing detection area at the expense of increasing the detector response time. A long response time is undesirable as regards detection of fast laser pulses for example. Moreover, in large area detectors a significant proportion of carriers recombine before collection by electrodes. If the detector's electronic field is high enough to effect electrode collection of carriers rather than recombination, noise becomes excessive. Optical immersion of a small detector allows a greater apparent area to be presented to incident radiation without the disadvantages associated with physically large detectors.

One method of making an optically immersed detector comprises attaching the detector to a substrate, and then employing an adhesive to attach the free detector surface to an immersion lens. This approach gives rise to difficulties in obtaining adequate light transmission through the adhesive and in avoiding differential thermal expansion leading to structural failure. Furthermore, CMT detectors in particular are surface passivated by a thin anodic film over an n+ mercury surface region. Passivation is necessary to avoid premature carrier recombination at the detector surface. It is very difficult to avoid the adhesive adversely affecting the passivated surface, either chemically or by differential thermal expansion when the detector is cooled.

It is an object of the invention to provide an alternative form of optically immersed infra-red detector assembly.

The present invention provides a detector assembly including a substrate, a semiconductor detector mounted on the substrate, lens contact pads disposed radially of the detector, and a lens mounted on the contact pads effecting optical immersion of the detector. This arrangement satisfies optical immersion criteria without requiring attachment of the detector to the lens.

The lens-detector separation should not be greater than one-tenth of the wavelength of radiation to be detected, and preferably less than one-twentieth. For $CO_2$ laser radiation at 10.6 $\mu$m, the preferred separation is not greater than 0.5 $\mu$m and the lens may be made of silicon, germanium or other infra-red transmissive materials.

A sapphire substrate and a CMT detector may be employed. In a preferred embodiment, the contact pads are of CMT and are attached to the lens by an adhesive layer defining the lens-detector separation. The lens may be hemispherical, or a suitable aspheric immersion lens arranged to correct for image curvature.

In an alternative aspect, the invention provides a method of making an optically immersed infra-red detector assembly comprising the steps of:

(1) mounting a portion of semiconducting detector material upon a substrate, (2) etching the portion to define a detector region with radially spaced lens contact pads such that the detector region and the pads have accurately coplanar surfaces and are electrically isolated from one another, (3) providing electrical contacts to the detector region, and (4) mounting an optical immersion lens on the contact pads with layers of adhesive to establish a lens/detector separation appropriate for optical immersion of the detector.

Step (4) is preferably implemented by applying a dilute adhesive to lens-contact pad interfaces for capillary attraction therebetween. The method may be implemented with CMT detector material, a sapphire substrate, gold electrical contacts, a silicon or germanium lens and an epoxy resin adhesive diluted in acetone. Etching in step (2) may conveniently be carried out by plasma etching.

Figure 2:
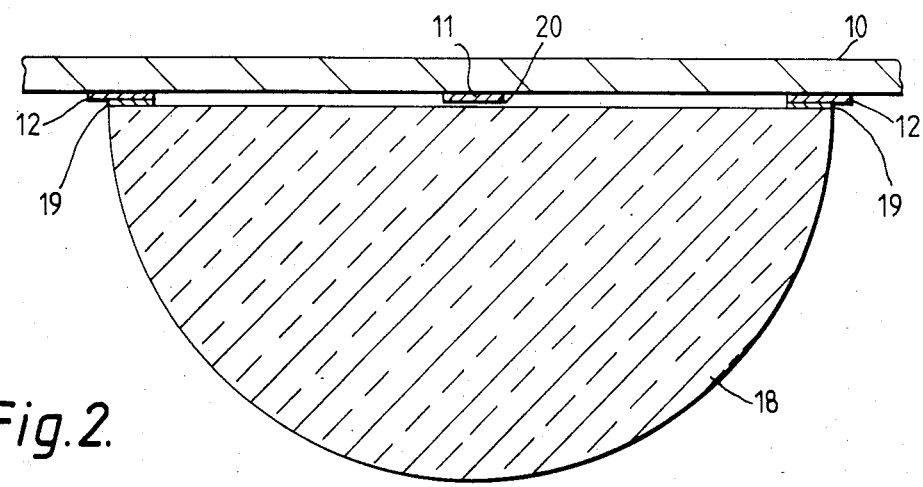

In order that the invention might be more fully understood, one embodient thereof will now be described, by way of example only, with reference to the accompanying drawings, in which:

FIG. 1 is a plan view of an optical immersion detector assembly of the invention, and FIG. 2 is a sectional view of the FIG. 1 assembly along lines R—R.

Referring to FIGS. 1 and 2, a planar sapphire substrate 10 bears a square CMT detector 11 and three arcuate CMT lens contact pads 12 spaced around a circle on the substrate 10. The square detector 11 is 70 $\mu$m on a side, and both it and the pads 12 are upstanding from the substrate 10. The detector 11 and pads 12 have accurately coplanar surfaces 14 and 15 respectively. Gold bias contacts 16 are deposited across the substrate 10 on the opposite edges 17 of the detector 11. A hemispherical silicon lens 18 is bonded to the pads 12 by very thin layers of adhesive 19. The adhesive layers 19 define a very narrow air gap 20 (not drawn to scale) between the detector 11 and lens 18. Optical immersion criteria require the air gap width to be small compared to the wavelength of the radiation of interest. It should be not more than 0.1$\lambda$ in width and preferably less than 0.05$\lambda$. For $CO_2$ laser radiation at 10.6 $\mu$m wavelength, the air gap 20 is <0.5 $\mu$m.

The detector assembly of FIGS. 1 and 2 is fabricated as follows. A CMT rectangle (not shown) is attached to a sapphire substrate 10, and is etched by known techniques to provide an accurately planar surface. The rectangle is then masked to cover detector and contact pad regions, and plasma etched so that the detector 11 and pads 12 become upstanding and electrically isolated from one another. After mask removal, gold contacts 16 are provided to the detector 11. The pads 12 are then cleaned with acetone to remove dust particles. The hemispherical lens 18 is laid on the pads 12 which protrude somewhat beyond the lens circumference 21 to facilitate attachment. A drop of dilute adhesive is applied at the points 22, the edge portions of the lens 18 where it contacts each pad 12. Capillary attraction draws the adhesive along each pad/lens interface 23 to form the adhesive layer 19 after solvent evaporation, thereby establishing the air gap 20 between the lens 18 and detector 11. An epoxy resin adhesive is employed, monomeric diglycidyl ether of bisphenol diluted in acetone.

The optical immersion approach theoretically gives a gain in sensitivity of $\mu^2$, where $\mu$ is the refractive index of the hemispherical lens, as compared to a non-immersed but otherwise equivalent detector. For silicon, $\mu$ is approximately 3.5 at the $CO_2$ laser wavelength of 10.6 μm, which corresponds to a gain of a factor of 12 in sensitivity. Tests on specimen devices of the invention have shown a gain of a factor of 6 in sensitivity, this being achieved without optimisation of the design. Detail improvements, such as cold shielding and antireflection lens coating, would improve the sensitivity gain. The assembly and method of construction hereinbefore described have the advantage of fulfilling the requirements of optical immersion and obtaining its benefits without requiring contact to the detector surface.

Whereas in the foregoing description, a hemispherical immersion lens is described, as is well known in optics a suitable aspheric immersion lens may be employed to correct for aberrations occurring at wide fields of view, eg non-paraxial ray effects.

We claim:

1. A detector assembly including:
   (1) a substrate,
   (2) a semiconductor detector mounted on the substrate,
   (3) lens contact pads disposed radially of the detector and made from the same semi-conducting material as the detector, and
   (4) a convex optical immersion lens mounted on the contact pads and spaced apart from the detector by a distance not greater than one tenth of a wavelength of the radiation for which the detector is designed.

2. A detector assembly according to claim 1 wherein the lens-detector separation is less than one tenth of the wavelength of radiation to be detected.

3. A detector assembly according to claim 2 wherein the lens-detector separation is less than one twentieth of the wavelength of radiation to be detected.

4. A detector assembly according to claim 2 or 3 wherein the lens is attached to each of the contact pads by respective layers of adhesive defining the lens-detector separation.

5. A detector assembly according to claim 4 wherein the detector and contact pads are produced from a single piece of semiconductor material.

6. A detector assembly according to claim 5 wherein the detector and contact pads are of cadmium mercury telluride material and the lens is infra-red transmissive.

* * * * *